United States Patent
Sekigawa (10) Patent No.: US 7,605,941 B2
(45) Date of Patent: Oct. 20, 2009

(54) DRAWING APPARATUS AND DRAWING-DATA-GENERATION APPARATUS THEREFOR AS WELL AS DRAWING METHOD AND DRAWING-DATA-GENERATION METHOD THEREFOR TO EFFICIENTLY PERFORM STABLE DRAWING OPERATIONS

(75) Inventor: Kazunari Sekigawa, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 972 days.

(21) Appl. No.: 11/064,087

(22) Filed: Feb. 24, 2005

(65) Prior Publication Data

US 2005/0184990 A1 Aug. 25, 2005

(30) Foreign Application Priority Data

Feb. 25, 2004 (JP) ............................. 2004-049821

(51) Int. Cl.
*G06K 15/00* (2006.01)
*G06T 11/20* (2006.01)
(52) U.S. Cl. ...................... 358/1.18; 358/1.16; 345/441
(58) Field of Classification Search ................ 358/1.16, 358/1.18; 345/441
See application file for complete search history.

(56) References Cited

U.S. PATENT DOCUMENTS

| 4,722,064 | A | * | 1/1988 | Suzuki | ....................... 358/1.15 |
| 5,138,561 | A | * | 8/1992 | Crowe | ......................... 358/1.3 |
| 6,266,455 | B1 | * | 7/2001 | Kobayashi | .................. 382/307 |
| 6,789,140 | B2 | * | 9/2004 | Kotani et al. | .................. 710/20 |

FOREIGN PATENT DOCUMENTS

JP 10-112579 4/1998

* cited by examiner

*Primary Examiner*—King Y Poon
*Assistant Examiner*—Javier Segura
(74) *Attorney, Agent, or Firm*—Staas & Halsey LLP (57) ABSTRACT

A drawing apparatus in which drawing data, which is required to perform a drawing operation on drawing blocks on a surface that can be drawn at one time by drawing heads moving relatively to said drawn surface, is sequentially generated based on design data and temporarily stored in a memory and, then, sequentially supplied to drawing engines comprises computing means for computing drawing start instruction data to start the relative movement and the drawing operation of the drawing heads after a delay from the start of production of the drawing data so that at least the drawing data is stored in the memory.

22 Claims, 10 Drawing Sheets

DRAWING APPARATUS AND DRAWING-DATA-GENERATION APPARATUS THEREFOR AS WELL AS DRAWING METHOD AND DRAWING-DATA-GENERATION METHOD THEREFOR TO EFFICIENTLY PERFORM STABLE DRAWING OPERATIONS

BACKGROUND OF THE INVENTION

1. Field of the Invention

The present invention relates to a drawing apparatus, and a drawing-data-generation apparatus therefor, in which drawing data, which is required to perform a drawing operation on drawing blocks on a surface that can be drawn at one time by drawing heads moving relatively to the drawn surface, is sequentially generated based on design data and temporarily stored in a memory and, then, sequentially supplied to drawing engines, as well as a drawing method and a drawing-data-generation method therefor, in which drawing data, which is required to perform a drawing operation on drawing blocks on a surface that can be drawn at one time by drawing heads of a drawing apparatus moving relatively to said drawn surface, is sequentially generated based on design data and temporarily stored in a memory and, then, sequentially supplied to drawing engines of said drawing apparatus.

2. Description of the Related Art

Generally speaking, wiring patterns of circuit boards are formed by exposing and developing substrates, based on design data on the wiring patterns to print the desired patterns on the substrates and, then, etching the substrates. In this exposure process, photomasks are typically used.

However, in the exposure process using the photomasks, as a substrate on a stage and a photomask are aligned with each other mechanically by moving them relatively, accuracy is degraded. Further, as the exposure process is affected profoundly by physical and chemical parameters, the substrate in exact accordance with drawing data cannot always be obtained after the exposure. For example, as the substrate itself may expand, shrink or distort due to ambient temperature of the substrate, mechanical stress applied to the substrate and the like, it is necessary to empirically optimize different process conditions (i.e. to empirically make adjustments of different process conditions) so that the desired pattern can be obtained by remaking photomasks of different layouts several times in consideration of such expansion, shrinkage or distortion. Still further, before mass production, in order to obtain optimal values for exposure conditions such as the dose of exposure, the exposure speed, the focus of light sources and so on, a set of inspections called "optimization" must be performed repeatedly to determine the optimal exposure conditions. In the exposure process using the photomasks, as the photomasks are needed even at the experimental stage where inspections are repeated many times, not to mention in the mass production of substrates, it is costly and very uneconomical to manufacture the masks.

In order to address the problem described above, in recent years, various patterning methods by direct drawing without using the photomasks have been proposed. According to the patterning methods by the direct drawing, the expansion, shrinkage, distortion or displacement of the substrate described above can be corrected either in advance in the stage of generating the drawing data or in real time and, therefore, improvements can be made such as increase in manufacturing accuracy, increase in yield, shortening of delivery times, reduction of manufacturing cost and so on.

Examples of the patterning methods by the direct drawing include: a method of forming exposure patterns by a direct exposure process using Digital Micromirror Device (DMD) or an electron beam exposure machine; a method of directly forming wiring patterns using an inkjet patterning machine having ink discharge heads; a method of directly forming resist patterns for etching process; and so on. Among these methods, in a typical conventional example of the patterning method by the direct exposure using DMD set forth in Japanese Unexamined Patent Publication No. 10-112579, when a resist formed on a substrate is exposed, pattern data is generated according to a pattern to be exposed, then, this pattern data is input to a Digital Micromirror Device (DMD), a plurality of micromirrors of the DMD are tilted according to the pattern data and, then, light is projected on the DMD so that the resist is illuminated by the light reflected from the micro mirrors and exposed in a shape according to the pattern data.

Figure 9:
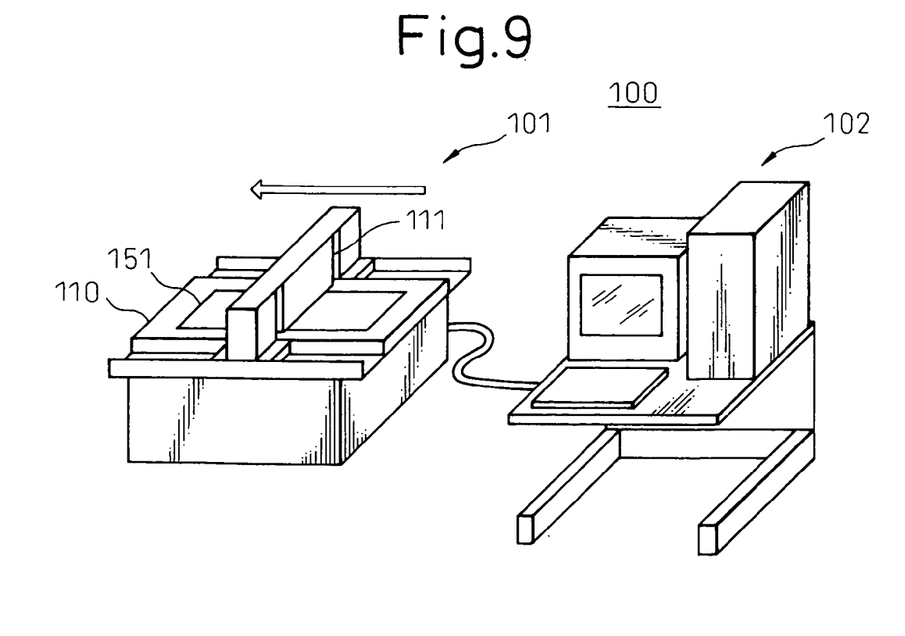
FIG. 9 is a diagram schematically showing a direct exposure system.

FIG. 9 is a diagram schematically showing a direct drawing system.

A direct drawing system 100 comprises: a drawing apparatus 101; and a computer 102 connected to the drawing apparatus 101. The computer 102 supplies drawing data to the drawing apparatus 101 and controls the drawing apparatus 101. The drawing apparatus 101 comprises: a stage 110 on which a substrate 151 is mounted; and drawing means 111 that moves above the drawn substrate 151 relatively thereto in the direction of the arrow in the figure. The drawing means 111 comprises a plurality of drawing heads (or drawing engines) (not shown), each of which is assigned to respective areas to be drawn on a surface of the substrate 151 and each of which performs drawing operations in parallel. Here, in the drawing means 111, the drawing heads are exposure heads in the case of the maskless exposure machine or the drawing heads are ink discharge heads in the case of the inkjet patterning machine.

Figure 10:
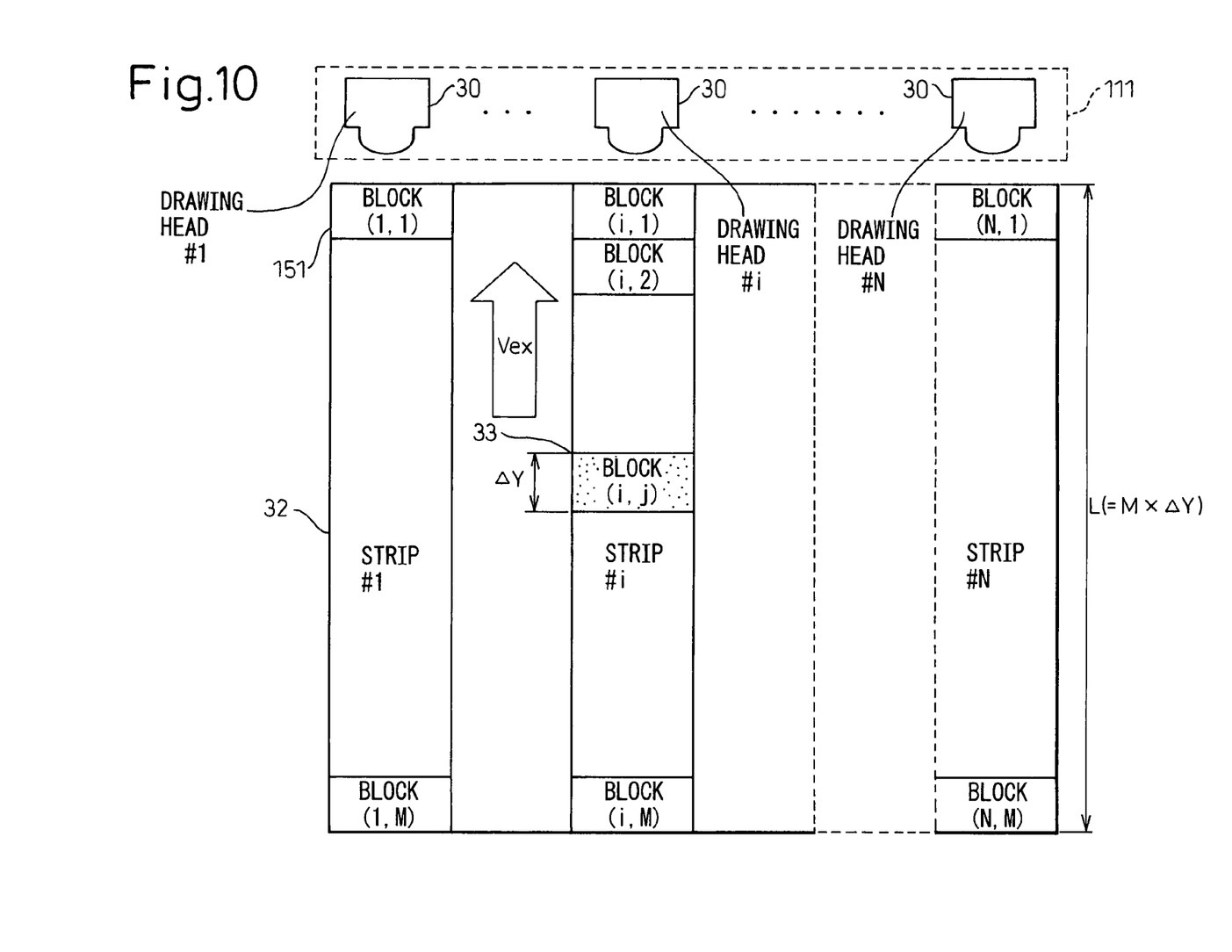
FIG. 10 is a diagram showing an operating principle of a direct exposure system.
Figure 11:
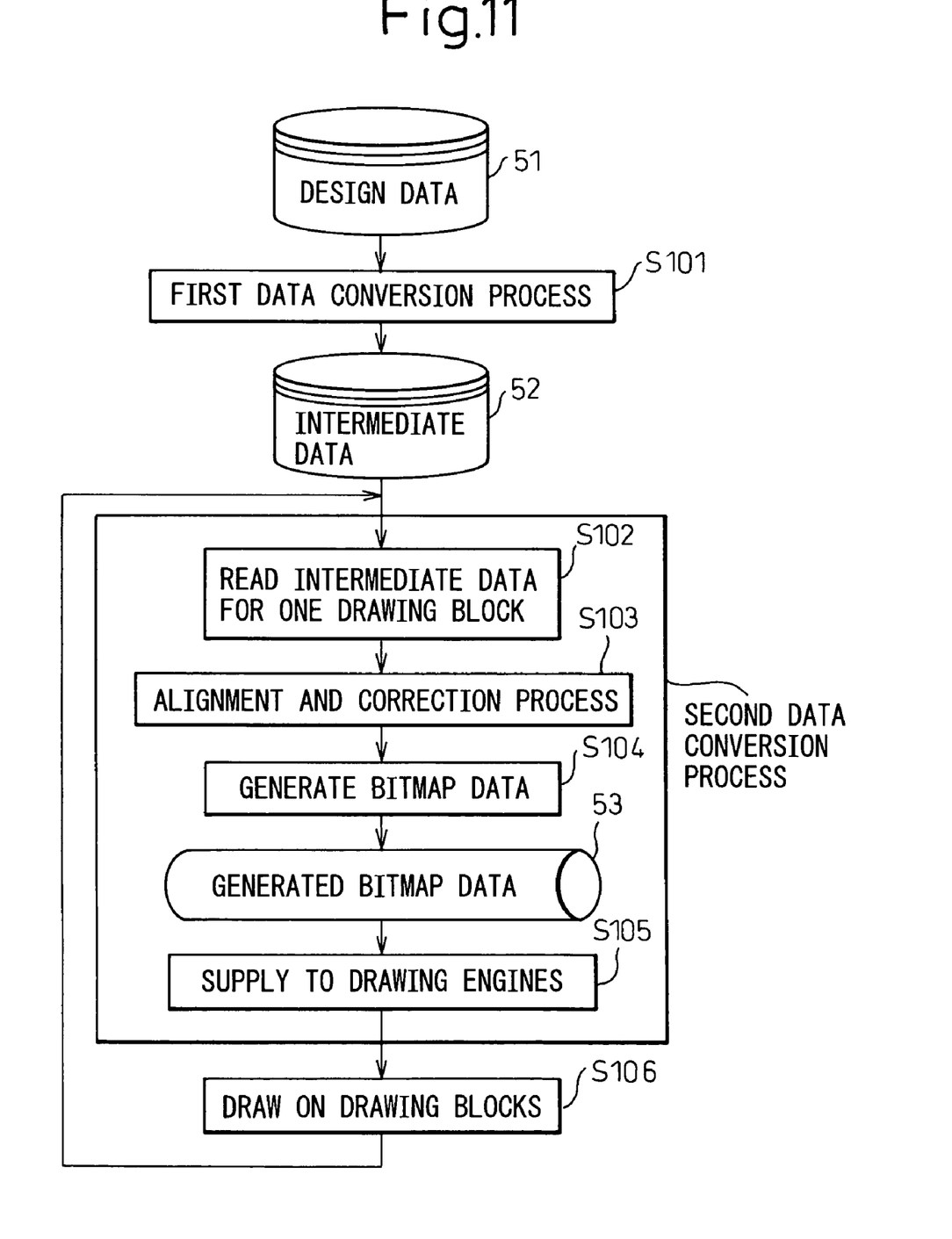
FIG. 11 is a flow chart showing a data process flow of a direct exposure system.

FIG. 10 is a diagram showing an operating principle of the direct drawing apparatus, and FIG. 11 is a flow chart showing a data process flow of the direct drawing apparatus.

The drawing means 111, which moves above the substrate 151 relatively thereto, comprises a plurality of drawing heads #1-#N (reference numeral 30) (where N is a natural number) aligned in the direction orthogonal to the relative movement of the substrate 151.

The substrate 151 is spatially divided into N areas referred to as "strips #1-#N" (reference numeral 32). Each drawing head #1-#N (reference numeral 30) performs drawing on the respective strips #1-#N (reference numeral 32) while moving relatively to the substrate 151 at a speed of Vex. Here, the length of the substrate 151 in the direction of the relative movement or, in other words, the length of the strips #1-#N (reference numeral 32) is defined as L (hereinafter referred to as the "strip length").

The area that can be drawn at one time by each drawing head #1-#N (reference numeral 30) is limited and, in the direction of the relative movement of the substrate 151, it has a length shorter than the strip length L. Therefore, each strip #1-#N (reference numeral 32) is spatially divided into respective M (where M is a natural number) "drawing blocks (i, j) (where $1 \leq i \leq N$, $1 \leq j \leq M$, the drawing blocks may be hereinafter simply referred to as "blocks")" (reference numeral 33) and the drawing operation is performed for each block (i, j) in a block-by-block manner. Here, the length of the block (i, j) in the direction of the relative movement is defined as $\Delta Y$. Therefore, a relationship of $L = M \times \Delta Y$ holds between the strip length L and the length $\Delta Y$ of the block (i, j) in the direction of the relative movement. Here, the length of each block (i, j)

in the direction orthogonal to the relative movement of the substrate 151 is equal to the width of each strip #1-#N (reference numeral 32).

The drawing data is typically bitmap data. The bitmap data has a very large data volume and, therefore, it is not preferable that a large amount of memory resources is required to generate and store the bitmap data in advance before performing the drawing operation. Therefore, in order to save the memory resources, the drawing data in bitmap form is generated based on design data so that it is spatially divided and assigned to each drawing head #1-#N (reference numeral 30) in real time during the drawing operation and it is temporarily stored in the memory and, then, sequentially supplied to the respective drawing heads #1-#N (reference numeral 30). The drawing heads #1-#N (reference numeral 30) performs the drawing operation based on the supplied drawing data in bitmap form.

As shown in FIG. 11, first, design data 51 is converted into intermediate data through a first data conversion process S101. Thus, the intermediate data 52 is formed by processing the design data 51 consisting of CAD data so that bitmap data can be more readily generated therefrom. Here, the intermediate data 52 has a smaller data volume than that of the bitmap data described below and, therefore, it may not be necessary to perform the first data conversion process S101 in real time during the drawing operation and the intermediate data 52 may be generated in advance and stored in the memory.

In step S102, the intermediate data for one drawing block is read. Then, with regard to the intermediate data read for the one drawing block, an alignment and correction process S103 is performed and, then, in step S104, the bitmap data 53 is generated and temporarily stored in the memory. In step S105, the bitmap data 53 is supplied to the respective drawing heads. Here, the real time processes S102-S105 described above are collectively referred to as a "second data conversion process". Each drawing head performs the drawing operation using the bitmap data 53 for each drawing block supplied through the second data conversion process. After the drawing operation of each drawing head for the respective one drawing block is completed, the process returns to step S102, where the second data conversion process is performed to obtain the bitmap data 53 for the next drawing block.

As described above, the drawing data used in the drawing process has a very large data volume, such as in the bitmap data form. Therefore, in order to save the memory resources, the drawing data is generated based on the design data in a block-by-block manner in real time during the drawing operation and the drawing data is supplied to the respective drawing heads. In other words, the drawing data for each drawing block is "produced" in real time by the second data conversion process described above and, then, sequentially "consumed" at a constant speed in a block-by-block manner in the respective drawing heads.

At this time, if the amount of "consumption" described above is larger than the amount of "production", losses of the drawing data to be supplied to the drawing heads occur and, therefore, the drawing process cannot be performed accurately. Such a problem is likely to occur, for example, when the alignment and correction process in FIG. 11 is complicated or the content of the drawing data for a particular drawing block is especially complicated.

In order to address this problem, it may be contemplated to temporarily inhibit or suspend the "consumption" when the "consumption" is likely to be excessive. More specifically, to inhibit or suspend the "consumption" is equivalent to changing the moving speed Vex of the substrate 151 relative to the drawing engines. However, for example, in the case when the drawing apparatus is a maskless exposure machine, wherein, as the relative moving speed Vex is reduced, a dose of exposure, or a cumulative light energy value applied to a certain area, is increased, optical energy of an exposure light source also must be controlled to obtain a constant dose of exposure and, therefore, the control of the entire system to obtain stable exposure results will become very complicated, which will result in increased manufacturing cost. Moreover, to reduce the relative moving speed Vex is equivalent to reducing the exposure speed, which will result in degraded productivity.

Alternatively, it may also be contemplated to generate all drawing data based on the design data before performing the drawing operation and store it in the memory so that the amount of "consumption" described above is never larger than the amount of "production". However, because the drawing data has a very large data volume as described above, a large amount of memory resources is required to store the data, which will also result in increased manufacturing cost.

Therefore, in view of the above problems, it is an object of the present invention to provide a drawing apparatus and a drawing-data-generation apparatus for the drawing apparatus as well as a drawing method and a drawing-data-generation method for the drawing method that can efficiently perform stable drawing operations in the case when drawing data required for the drawing operations is sequentially generated based on design data and sequentially supplied to drawing engines.

SUMMARY OF THE INVENTION

In order to achieve the above object, in the present invention, there is provided a drawing method in which drawing data, which is required to perform a drawing operation on drawing blocks on a surface that can be drawn at one time by drawing heads of a drawing apparatus moving relatively to the drawn surface, is sequentially generated based on design data and temporarily stored in a memory and, then, sequentially supplied to drawing engines of the drawing apparatus, wherein an amount of drawing data to be produced before starting the relative movement of the drawing heads and the drawing operation of the drawing heads is determined in advance and, then, the relative movement and the drawing operation of the drawing heads is started after a delay from the start of the production of the drawing data so that the drawing data is always stored in the memory.

The amount of drawing data to be produced before starting the relative movement and the drawing operation of the drawing heads is determined by performing a series of computation processes from generating the drawing data based on the design data to supplying it to the drawing engines computationally without an actual drawing operation. In this specification, the procedure for measuring and estimating the time required for the series of computation processes described above, only by performing the computation processes without performing actual drawing operation, is referred to as an "idle running". In the present invention, the idle running is performed in advance before mass production of substrates.

Figure 1:
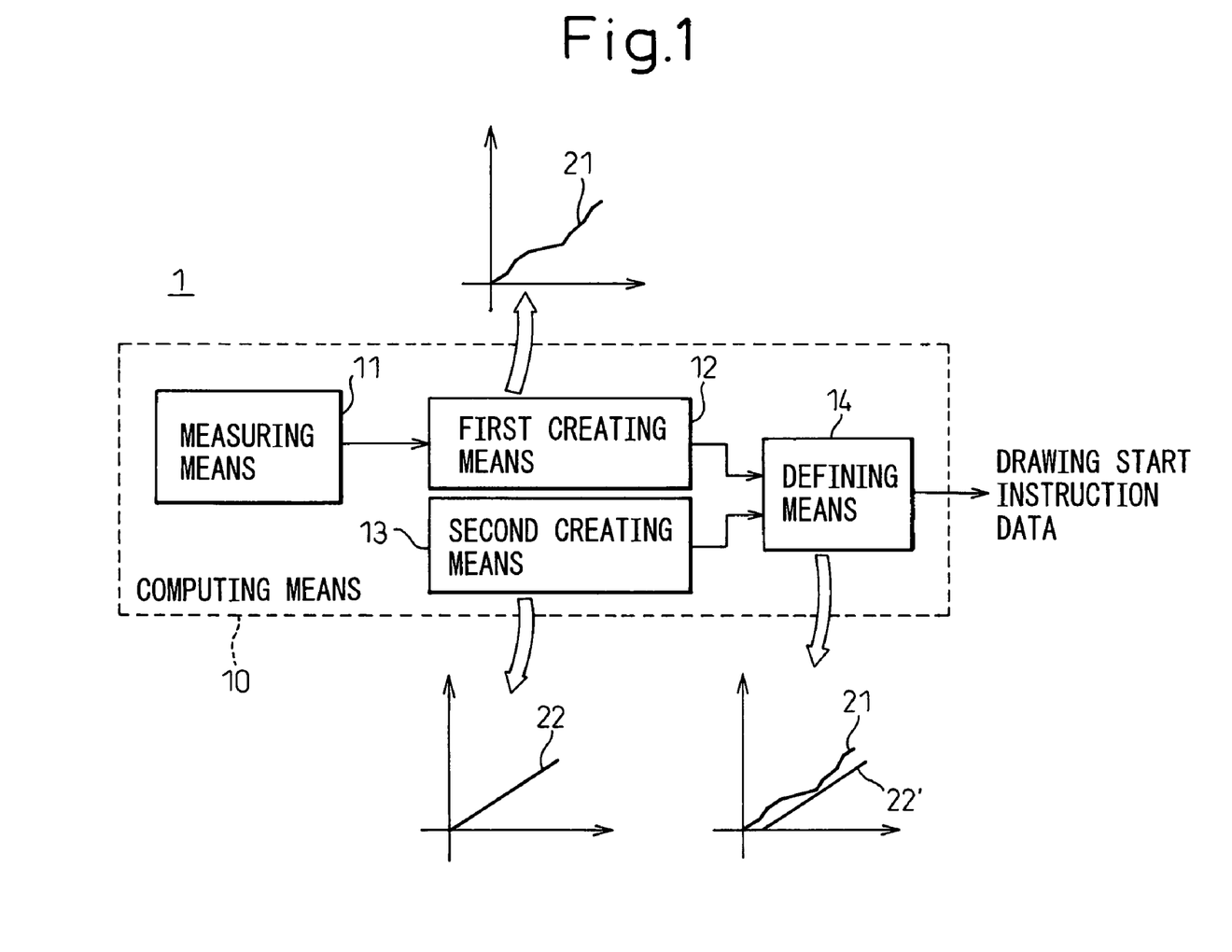
FIG. 1 is a principle block diagram of the present invention.

FIG. 1 is a principle block diagram of the present invention.

A drawing apparatus 1 in which drawing data, which is required to perform a drawing operation on drawing blocks on a surface that can be drawn at one time by drawing heads moving relatively to the drawn surface, is sequentially generated based on design data and temporarily stored in a memory and, then, sequentially supplied to drawing engines, comprises computing means 10 for computing drawing start instruction data to start the relative movement and the drawing operation of the drawing heads after a delay from the start of production of the drawing data so that at least the drawing data is stored in the memory.

This computing means 10 comprises:

measuring means 11 for measuring and estimating time points to start the generation of each of the drawing data and time points to complete the supply of the drawing data to the drawing engines by performing a series of computation processes from generating the drawing data based on the design data to supplying it to the drawing engines;

first creating means 12 for creating data generation profiles 21 that show on a graph a relationship between the estimated time points to start the generation and to complete the supply for each of the drawing data and positions of the drawing blocks corresponding to the drawing data on the drawn surface;

second creating means 13 for creating, on the graph, a drawing speed line 22 that shows change over time of coordinates of the drawing heads with respect to the drawn surface by using a moving speed of the drawing heads relative to the drawn surface; and defining means 14 for comparing the data generation profiles 21 with the drawing speed line 22, calculating a starting point of the drawing speed line 22' that allows each point on the data generation profiles 21 to precede in time each point on the drawing speed line 22 at all coordinate positions of the drawing heads and, then, defining this starting point as a time point to start the relative movement and the drawing operation of the drawing heads.

Further, according to the present invention, the drawing apparatus 1 preferably further comprises integrated data generating means (not shown) for generating integrated data that includes at least: the drawing data; and the drawing start instruction data, computed in advance by the computing means, to perform a desired drawing operation using the integrated data.

BRIEF DESCRIPTION OF THE DRAWINGS

The present invention will be more clearly understood from the description as set below with reference to the accompanying drawings, wherein.

DESCRIPTION OF THE PREFERRED EMBODIMENTS

Figure 2:
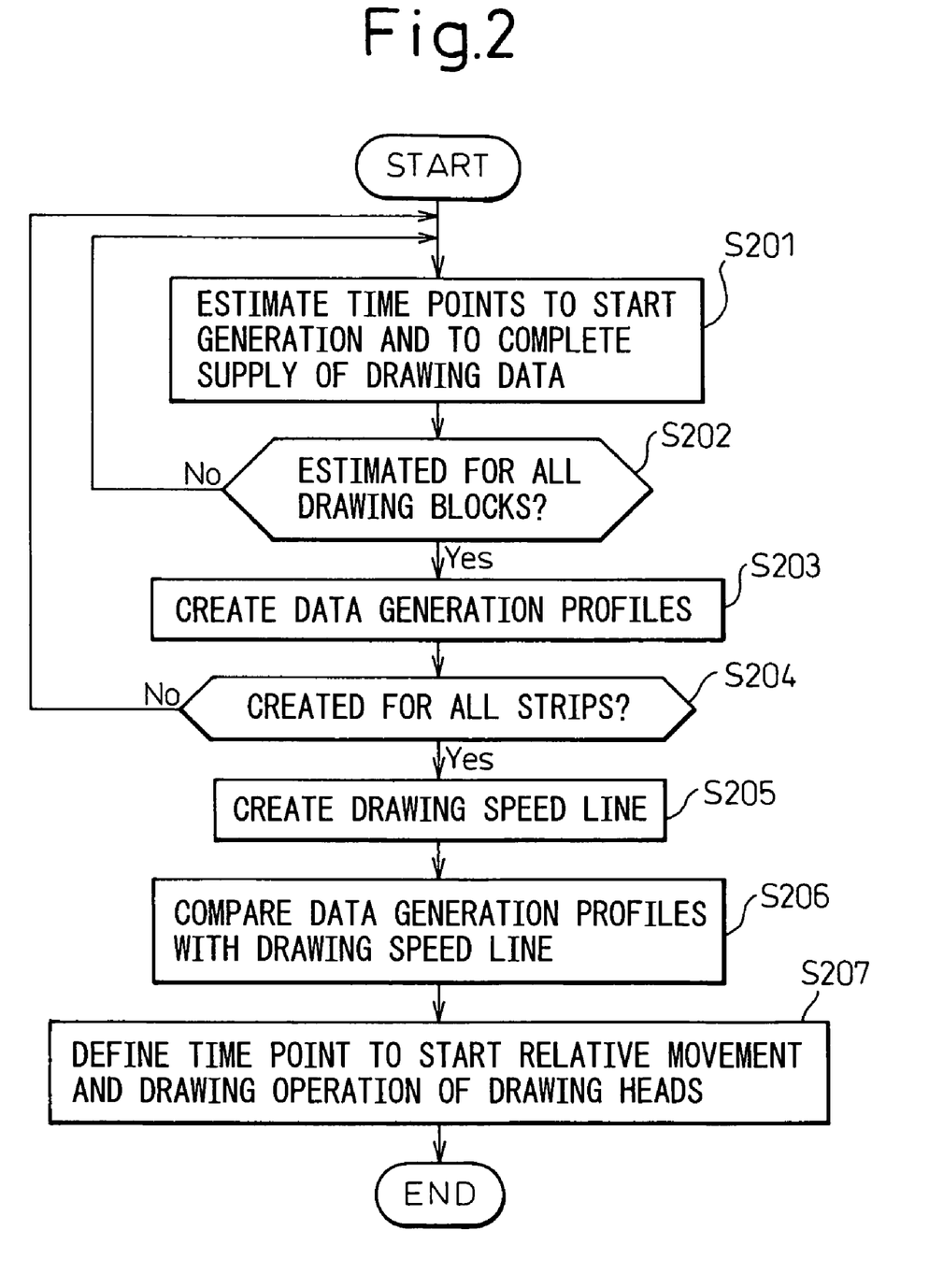
FIG. 2 is a flow chart showing an operational flow of a drawing apparatus according to an embodiment of the present invention.

FIG. 2 is a flow chart showing an operational flow of a drawing apparatus according to an embodiment of the present invention.

In this embodiment, as already described with reference to FIG. 10, it is assumed that drawing means 111, which moves above a substrate 151 relative thereto, comprises a plurality of drawing heads #1-#N (reference numeral 30) in the direction orthogonal to the relative movement of the substrate 151 and performs a drawing operation on each strip #1-#N (reference numeral 32), into which the drawing substrate 151 is spatially divided, for each block (i, j) (reference numeral 33) in a block-by-block manner at a drawing speed Vex. As already described, drawing data required for drawing one block (i, j) (reference numeral 33), which is typically bitmap data, is generated for each block (i, j) (reference numeral 33) based on design data in real time during the drawing operation and sequentially supplied to the respective drawing heads #1-#N (reference numeral 30).

In this embodiment, before actual mass production of the substrates, an "idle running" is performed to determine in advance an amount of drawing data to be produced before starting the relative movement of the drawing heads and the drawing operation of the drawing heads or, in other words, a time point to start the relative movement of the drawing heads and the drawing operation of the drawing heads. During the idle running, the actual drawing operation is not performed but only computation processes are performed.

First, in step S201 of FIG. 2, the idle running is performed for given drawing data to measure and estimate a time point to start the generation of the drawing data and a time point to complete the supply of the drawing data to drawing engines, wherein the idle running is a series of computation processes from generating the drawing data based on the design data to supplying it to the drawing engines.

In step S202, it is determined whether the processes of step S201 have been performed and the time point to start the generation of the drawing data and the time point to complete the supply of the drawing data to the drawing engines, have been estimated for all drawing blocks on a given strip.

If the time point to start the generation of the drawing data and the time point to complete the supply of the drawing data to the drawing engines have been estimated for all drawing blocks on the strip, in step S203, a data generation profile is created to show on a graph a relationship between the estimated time points to start the generation and to complete the supply for the drawing data on the strip and the positions of the drawing blocks corresponding to the drawing data on a drawn surface.

Figure 3:
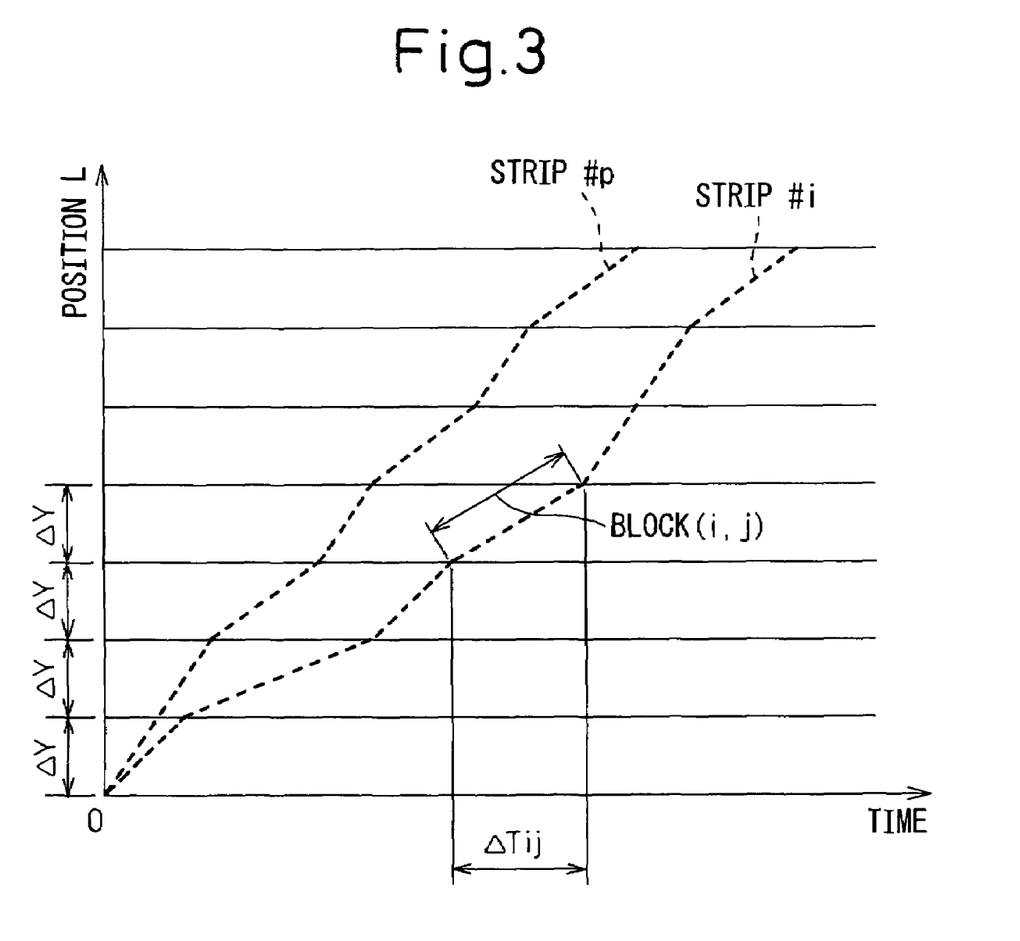
FIG. 3 is a diagram for describing exemplary data generation profiles in an embodiment of the present invention.

FIG. 3 is a diagram for describing exemplary data generation profiles in an embodiment of the present invention. In a graph shown in this figure, coordinate axes are defined so that the horizontal axis shows time and the vertical axis shows positions of the drawing heads in the direction of the relative movement, which are similar to those in the subsequent graphs.

Once the time points to start the production and to complete the supply of the drawing data have been measured and estimated in step S201, it is possible to estimate a time $\Delta Tij$ required for the series of computation processes from generating the drawing data for a given drawing block (i, j) based on the design data to supplying it to the drawing engine. If the time point to start the generation of the drawing data has been estimated, as shown in FIG. 3, a starting point is determined by the time point to start the generation of the drawing data and the starting coordinates of the drawing block corresponding to the drawing data in the direction of the relative movement. Similarly, if the time point to complete the supply of the drawing data to the drawing engine has been estimated, an ending point is determined by the time point to complete the supply of the drawing data and the ending coordinates of the drawing block corresponding to the drawing data in the direction of the relative movement. By determining the starting points and ending points for all drawing blocks on the strip and interconnecting them, a line graph as shown in FIG. 3 can be obtained. Here, the gradient $\Delta Y/\Delta Tij$ of a segment of the line graph corresponds to the processing speed from generating the drawing data for the drawing block to supplying it. When the content of the drawing data for the drawing block (i, j) is complicated or complicated computation processes are required, the processing speed mentioned above and, therefore, the gradient $\Delta Y/\Delta Tij$ is reduced. When the content of the drawing data or the time required for the series of computation processes varies for each drawing block, the data generation profile exhibits a zigzag shape.

In the present invention, the data generation profiles are created for each strip (or each group of drawing blocks) in the direction of the relative movement, which corresponds to a respective one of a plurality of drawing heads aligned in the direction orthogonal to the relative movement of the drawing heads. Therefore, the "idle running" must be performed for all strips on the substrate. In step S204 of FIG. 2, it is determined whether the data generation profiles have been created for all strips on the substrate.

In this connection, when the "idle running" is performed several times for the same strip, some errors may occur depending on load conditions of the computer and, therefore, the resultant data generation profile may vary. The "idle running" must be performed at least once for all strips on the substrate and, moreover, considering the possible errors described above, it is desirable to perform the "idle running" plural times (for example, R times, where R is a natural number). By performing the idle running R times for each of N strips, N×R data generation profiles are obtained.

Further, when a plurality (for example, C, where C is a natural number) of correction formulae used for an alignment and correction process are provided in the series of calculation processes from generating the drawing data based on the design data to supplying it to the drawing engines, by performing the idle running R times for each of the N strips with the C correction formulae, N×R×C data generation profiles are obtained. By assuming a plurality of usage conditions and creating the corresponding data generation profiles in advance, the user's operability can be improved. In FIG. 3, it should be noted that only two data generation profiles are shown for the sake of simplicity.

Figure 4:
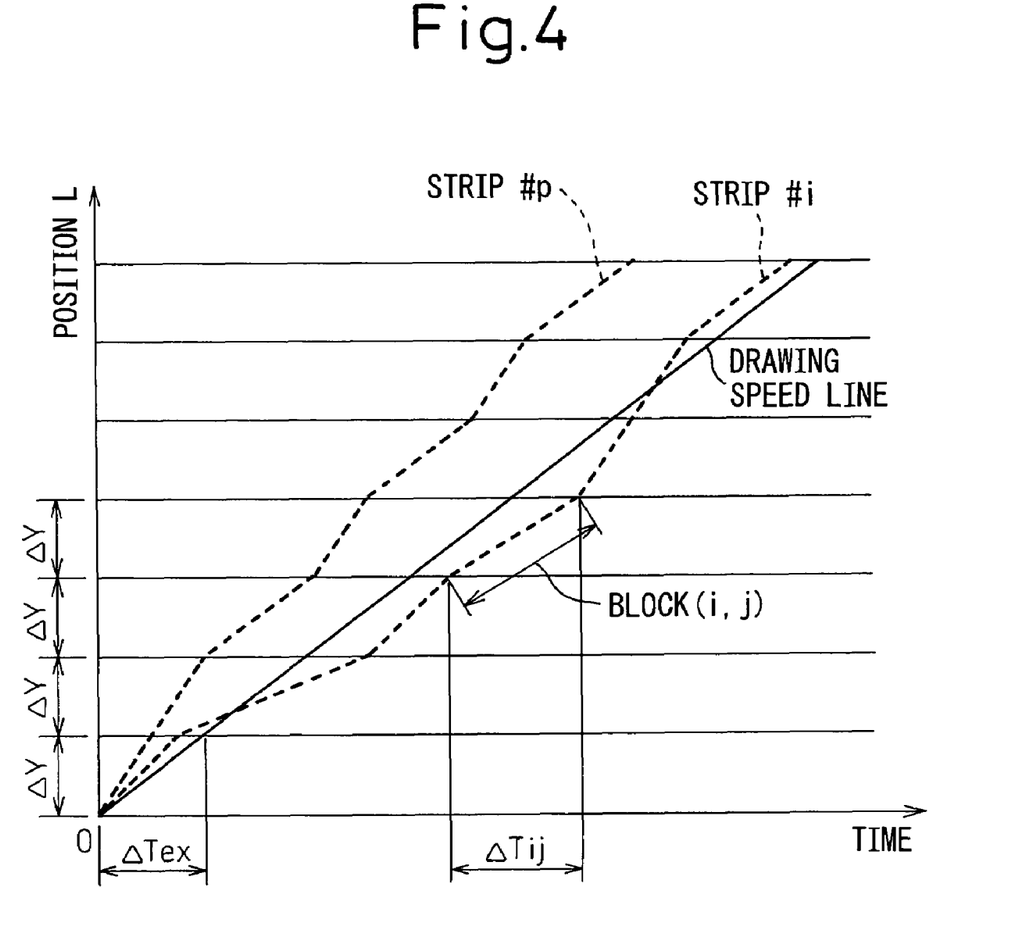
FIG. 4 is a diagram for describing a drawing speed line in an embodiment of the present invention.

In step S205 of FIG. 2, by using the moving speed Vex of the drawing heads relative to the drawn surface, a drawing speed line is created on the graph described above to show change over time of the coordinates of the drawing heads with respect to the drawn surface. As described above, the relative moving speed Vex is the drawing speed of the drawing heads. FIG. 4 is a diagram for describing the drawing speed line in an embodiment of the present invention. The relative moving speed Vex of the drawing heads relative to the drawn surface is constant in this embodiment and, if the time required for one drawing process of the drawing heads is assumed to be $\Delta$Tex, the relative moving speed Vex is expressed as a drawing speed line having a gradient of $\Delta Y/\Delta Tex$. In this connection, it is to be noted that the series of processes of steps S201-S204 and the process of step S205 may be performed in the reverse order.

In step S206 of FIG. 2, the data generation profiles are compared with the drawing speed line. After the data generation profiles and the drawing speed line have been created in steps S201-S205, a graph as illustrated in FIG. 4 is obtained. In FIG. 4, as the data generation profile for the strip #p is always above the drawing speed line, it can be seen that the drawing data is always stored in the memory while it is generated based on the design data and, then, supplied to the drawing head. Therefore, in the strip #p, the drawing operation can be performed normally without loss of the drawing data supplied to the drawing head. On the other hand, as the data generation profile corresponding to the strip #i is below the drawing speed line in some segments, the drawing data is lost in such segments and the drawing operation cannot be performed normally.

Figure 5:
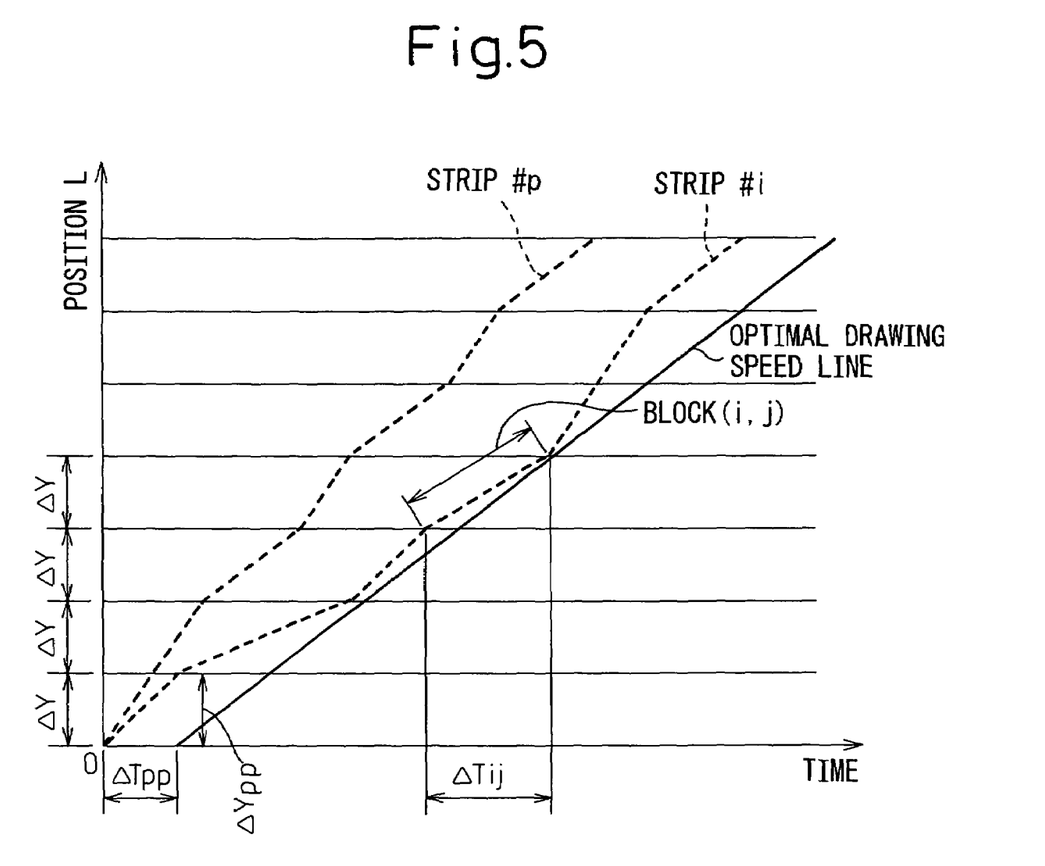
FIG. 5 is a diagram for describing determination of a time point to start a relative movement and a drawing operation of drawing heads in an embodiment of the present invention.

In step S207, a starting point of the drawing speed line is calculated to allow each point on the data generation profiles to precede in time each point on the drawing speed line at all coordinate positions of the drawing heads and, then, this starting point is defined as a time point to start the relative movement and the drawing operation of the drawing heads. FIG. 5 is a diagram for describing the determination of the time point to start the relative movement and the drawing operation of the drawing heads in an embodiment of the present invention. The drawing speed line is translated in the positive direction of the time axis so that the data generation profiles never fall below the drawing speed line. As a result, each point on the data generation profiles precede in time each point on the drawing speed line. A point where the drawing speed line at this time (or the optimal drawing speed line) intersects the time axis is calculated and this starting point is defined as the time point to start the relative movement and the drawing operation of the drawing heads. From the example shown in FIG. 5, it can be seen that the drawing data to be supplied to the drawing heads is never lost if the starting time of the relative movement and the drawing operation of the drawing heads is delayed from the start of the generation of the drawing data by a time $\Delta$Tpp (hereinafter referred to as the "delay time"). The delay time $\Delta$Tpp is ideally such a value that the necessary amount of the drawing data, which is generated based on the design data and stored in the memory before it is supplied to the drawing heads, can be minimized but it is preferably determined with the addition of some time allowance in consideration of computational errors and the like. Thus, in the present invention, the relative movement and the drawing operation of the drawing heads is started after a delay from the start of the generation of the drawing data so that at least the drawing data is stored in the memory. Data on this starting instruction is stored as "drawing start instruction data". The drawing start instruction data consists of data on the delay time $\Delta$Tpp, the minimum value $\Delta$Ypp of the variation of the data generation profiles corresponding to the delay time $\Delta$Tpp (see FIG. 5), or both of them.

After integrated data is generated to include at least this drawing start instruction data and the drawing data and, then, the integrated data is input to the drawing apparatus, the drawing apparatus perform a desired drawing operation using the integrated data.

Figure 6:
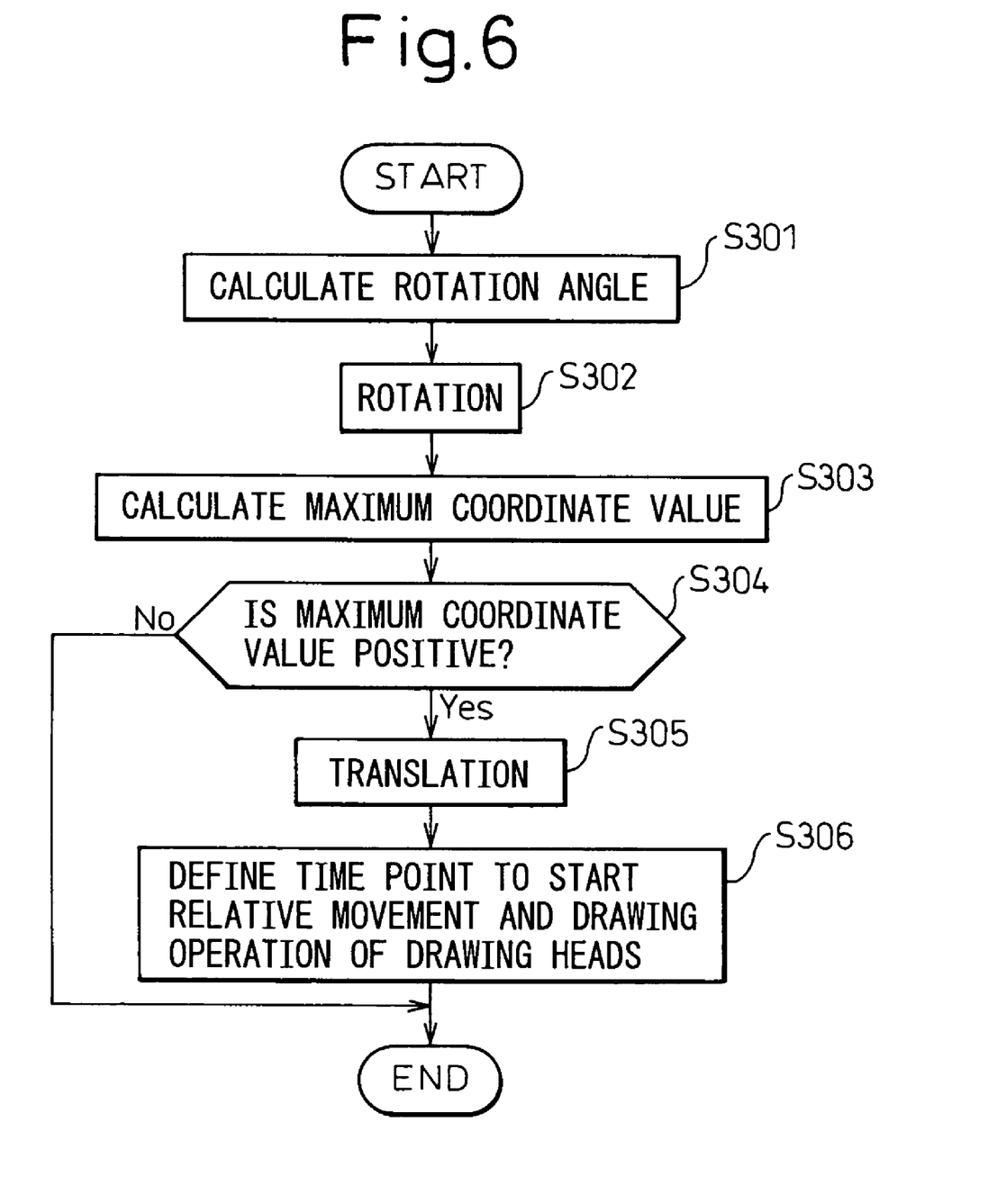
FIG. 6 is a flow chart showing an exemplary method for calculating an optimal drawing speed line in an embodiment of the present invention.
Figure 7A:
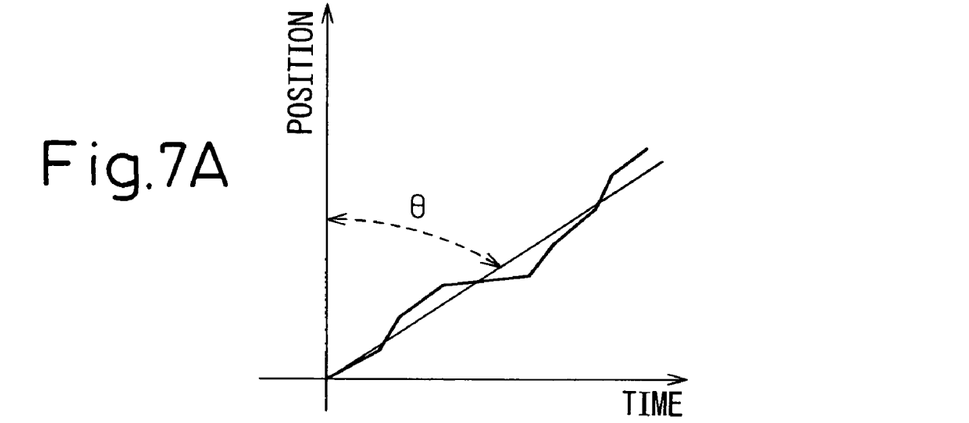
FIGS. 7A-7C are diagram for describing the flow chart shown in FIG. 6 by using a specific data generation profile and a drawing speed line.
Figure 7B:
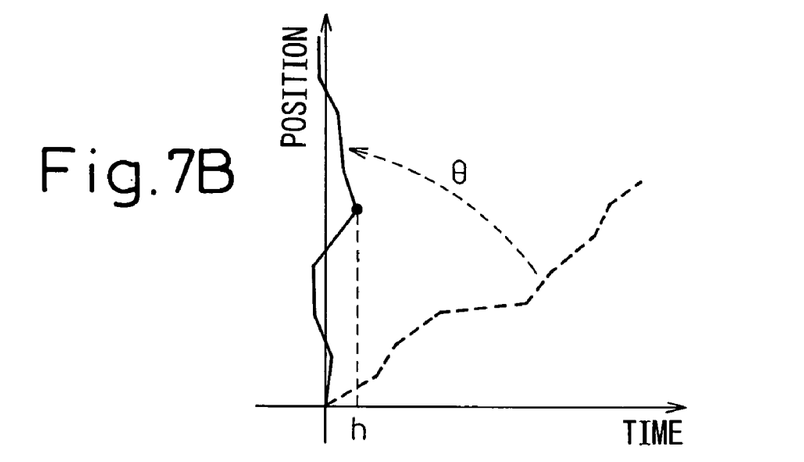
Figure 7C:
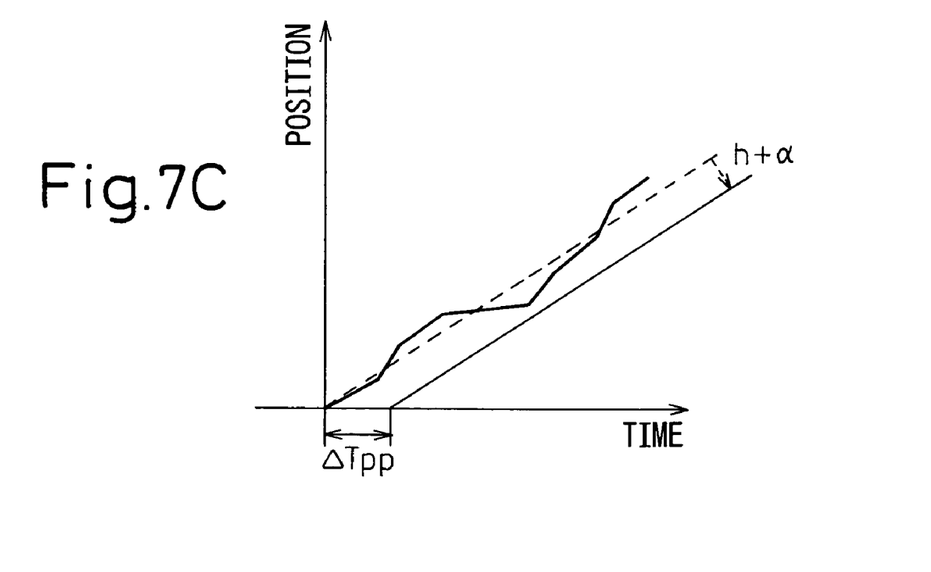

Next, a calculation of the optimal drawing speed line that allows all the data generation profiles to be above the drawing speed line will be described briefly. FIG. 6 is a flow chart showing an exemplary method for calculating the optimal drawing speed line in an embodiment of the present invention, and FIGS. 7A-7C are a diagram for describing the flow chart shown in FIG. 6 by using a specific data generation profile and drawing speed line.

First, in step S301 of FIG. 6, an angle between the drawing speed line and a first axis of the graph is calculated and, then, in step S302, the data generation profile is rotated toward the first axis by this angle. In the example shown in FIGS. 7A-7C, the angle between the drawing speed line and the coordinate axis (the coordinate axis showing the direction of the relative movement of the drawing heads) is θ as shown in FIG. 7A and, therefore, the data generation profile is rotated toward the coordinate axis by the rotation angle θ as shown in FIG. 7B.

In step S303, a maximum coordinate value that is taken by the rotated data generation profile in the direction of a second axis (or time axis) different from the first axis, is calculated. As shown in FIG. 7B, the maximum coordinate value of the data generation profile in the time axis is obtained as h.

In step S304, it is determined whether the maximum coordinate value obtained in step S303 is positive or not. In the example in FIG. 7B, the maximum coordinate value h is positive.

In step S305, if the maximum coordinate value h is determined to be positive in step S304, the drawing speed line is translated in the positive direction of the second axis at least by the magnitude of the maximum coordinate value. In this example, the drawing speed line is translated by h+α, as shown in FIG. 7C.

In step S306, an intersection point of the translated drawing speed line and the second axis is calculated and, then, the coordinate of this intersection point on the second axis is defined as the time point to start the relative movement of the drawing heads and the drawing operation of the drawing heads. Thus, the intersection point of the translated drawing speed line and the time axis is obtained as shown in FIG. 7C and, therefore, this intersection point is defined as the delay time ΔTpp that represents the time point to start the relative movement and the drawing operation of the drawing heads.

In this connection, besides the method described above, for example, the optimal drawing speed line that allows all the data generation profiles to be above the drawing speed line may be found by calculating all the positional relationship between the drawing speed line and the data generation profiles while the drawing speed line is translated little by little.

Figure 8:
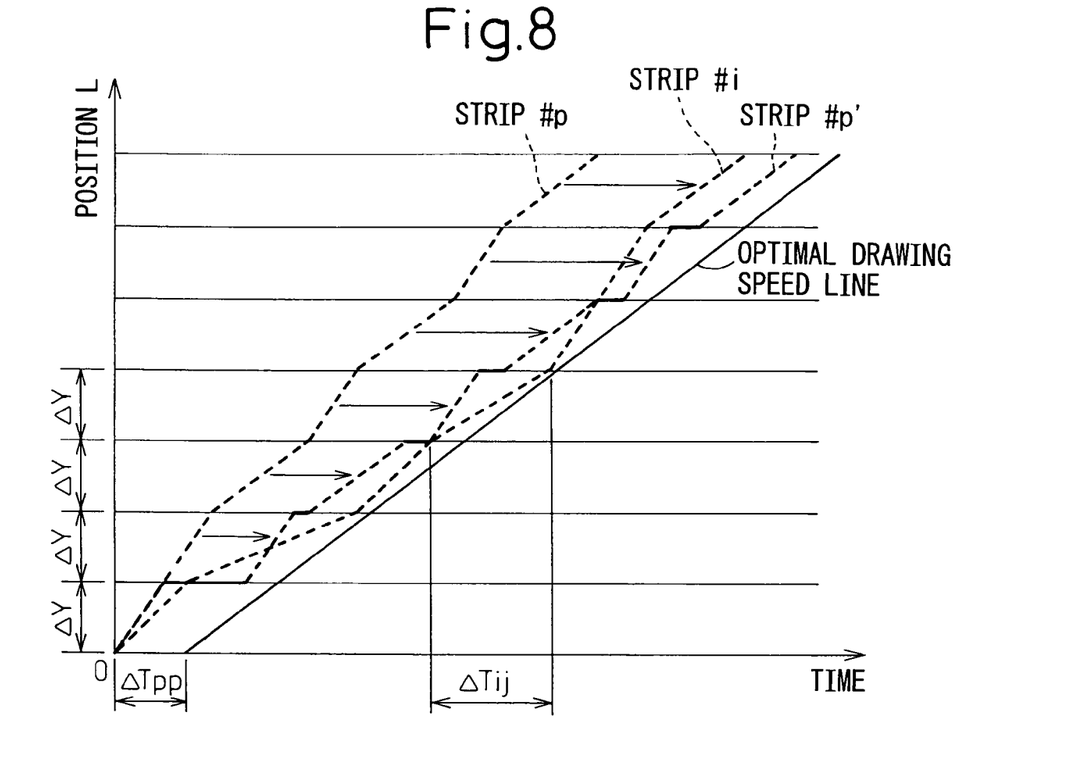
FIG. 8 is a diagram for describing a variation of an embodiment of the present invention.

FIG. 8 is a diagram for describing a variation of an embodiment of the present invention.

As shown in this figure, the data generation profile for the strip #p is sufficiently above the drawing speed line. It means that the drawing engine for the strip #p performs the drawing operation sufficiently fast. In other words, it means that the supply amount of the exposure data is sufficiently larger than the consumption amount of the exposure data by the drawing head and, thus, the exposure data is "produced excessively". In this case, it is not preferable to uselessly consume the memory for temporarily storing the exposure data. Therefore, in this case, a handshake is performed with the exposure engine to temporarily suspend the production of the exposure data. In the example shown in FIG. 8, with regard to the strip #p, when the amount of drawing data stored in the memory becomes larger than a predetermined value, after the presently produced drawing data is supplied completely, further generation of the drawing data is suspended temporarily. As a result, as shown in FIG. 8, a data generation profile #p' having horizontal segments, where the production of the exposure data is suspended, is obtained. The generation of said further drawing data is started before any horizontal segment intersects the drawing speed line. It allows the data generation profile #p to always be above the drawing speed line only to the extent that the former does not intersect the latter and, therefore, the amount of the drawing data stored in the memory can be reduced. The computer in the drawing engine, which performs no operation in the standby state where the production of the exposure data is suspended, can use its computing capacity for other operations in the meantime and, thus, the computer resources can be utilized efficiently.

The present invention can be applied to a drawing apparatus and a drawing-data-generation apparatus for the drawing apparatus, in which drawing data, which is required to perform a direct drawing operation on drawing blocks on a surface that can be drawn at one time by drawing heads moving relatively to the drawn surface, is sequentially generated based on design data and temporarily stored in a memory and, then, sequentially supplied to drawing engines. The present invention can be applied to the drawing apparatus, which may be either a maskless exposure machine or an inkjet patterning machine.

According to the present invention, in the drawing apparatus in which the drawing data required for the drawing operation is sequentially generated based on the design data and temporarily stored in the memory and, then, sequentially supplied to the drawing engines, an amount of drawing data to be produced before starting the relative movement and the drawing operation of the drawing heads is determined in advance so that the drawing data is always stored in the memory and, then, the relative movement and the drawing operation of the drawing heads is started after a delay from the start of the production of the drawing data so that the drawing operation is performed while the minimum necessary data is stored and, as a result, stable drawing operations can be performed efficiently. In particular, according to the present invention, the amount of drawing data, which is generated based on the design data and stored in the memory before the supply to the drawing heads, can be easily controlled to an optimal value or, preferably, the minimum necessary value and, therefore, the memory and computer resources can be utilized efficiently.

According to a patterning method using the direct drawing to which the present invention is applied, wiring density can be increased because high-precision wiring can be designed, inspected and formed easily and quickly and, on the other hand, alignment can be performed with smaller margins. Therefore, it can well accommodate ultrafine wiring in the future. Further, it has an advantage that the design data can be processed appropriately to accumulate correction information so that correction and routing can be performed dynamically and, as a result, design changes can be accommodated flexibly. In particular, according to the present invention, the memory and computer resources can be utilized efficiently.

What is claimed is:

1. A drawing apparatus in which drawing data, which is required to perform a drawing operation on drawing blocks on a surface that can be drawn at one time by drawing heads moving relatively to said drawn surface, is sequentially generated based on design data and temporarily stored in a memory and, then, sequentially supplied to drawing engines, comprising:

computing means for computing drawing start instruction data to start the relative movement and the drawing operation of said drawing heads after a delay from the start of generation of said drawing data so that at least said drawing data is stored in said memory, wherein said computing means includes measuring means for measuring and estimating time points to start the generation of each of said drawing data and time points to complete the supply of said drawing data to said drawing engines by performing a series of computation processes from generating said drawing data based on said design data to supplying it to said drawing engines, first creating means for creating data generation profiles that show on a graph a relationship between said estimated time points to start the generation and to complete the supply for each of said drawing data and positions of said drawing blocks corresponding to said drawing data on said drawn surface, second creating means for creating, on said graph, a drawing speed line that shows change over time of coordinates of said drawing heads with respect to said drawn surface by using a moving speed of said drawing heads relative to said drawn surface, and defining means for comparing said data generation profiles with said drawing speed line, calculating a starting point of said drawing speed line that allows each point on said data generation profiles to precede in time each point on said drawing speed line at all coordinate positions of said drawing heads and, then, defining this starting point as a time point to start the relative movement and the drawing operation of said drawing heads.

2. A drawing apparatus according to claim 1, further comprising integrated data generating means for generating integrated data that includes at least: said drawing data; and said drawing start instruction data computed in advance by said computing means, wherein said drawing apparatus performs a desired drawing operation using said integrated data.

3. A drawing apparatus according to claim 1, wherein said data generation profiles for each of said drawing data are obtained on said graph by interconnecting:

starting points that are determined by said time points to start the generation of said drawing data and starting coordinates of said drawing blocks corresponding to said drawing data in the direction of said relative movement; and ending points that are determined by said time points to complete the supply of said drawing data and ending coordinates of said drawing blocks corresponding to said drawing data in the direction of said relative movement.

4. A drawing apparatus according to claim 1, wherein said defining means has:

first calculating means for calculating an angle between said drawing speed line and a first axis of said graph;

second calculating means for rotating said data generation profiles by said angle toward said first axis;

third calculating means for calculating a maximum coordinate value that is taken by said rotated data generation profiles in the direction of a second axis different from said first axis;

fourth calculating means for determining whether said maximum coordinate value is positive or not;

fifth calculating means for translating said drawing speed line in the positive direction of said second axis at least by the magnitude of said maximum coordinate value, if said maximum coordinate value is determined to be positive by said fourth calculating means; and sixth calculating means for calculating an intersection point of said translated drawing speed line and said second axis and, then, defining the coordinate of said intersection point on said second axis as the time point to start the relative movement and the drawing operation of said drawing heads.

5. A drawing apparatus according to claim 1, wherein said data generation profiles are generated for each group of the drawing blocks aligned in the direction of said relative movement, wherein said each group corresponds to a respective one of a plurality of the drawing heads aligned in a direction orthogonal to the relative movement of said drawing heads, and said defining means compares a plurality of said data generation profiles with said drawing speed line, calculates a starting point of said drawing speed line that allows each point on said data generation profiles to precede in time each point on said drawing speed line at all coordinate positions of said drawing heads and, then, defines this starting point as a time point to start the relative movement and the drawing operation of said drawing heads.

6. A drawing apparatus according to claim 3, further comprising:

determining means for determining whether an amount of said drawing data stored in said memory is larger than a predetermined value; and suspending means for temporarily suspending further generation of said drawing data after completing said supply of said drawing data, if the amount of said drawing data stored in said memory is determined to be larger than said predetermined value by said determining means.

7. A drawing-data-generation apparatus for generating, based on design data, drawing data that is temporarily stored in a memory and, then, supplied to drawing engines of a drawing apparatus for performing a drawing operation on drawing blocks on a surface that can be drawn at one time by drawing heads of the drawing apparatus moving relatively to said drawn surface, comprising:

computing means for computing drawing start instruction data to start the relative movement and the drawing operation of said drawing heads after a delay from the start of generation of said drawing data so that at least said drawing data is stored in said memory, wherein said computing means includes measuring means for measuring and estimating time points to start the generation of each of said drawing data and time points to complete the supply of said drawing data to said drawing engines by performing a series of computation processes from generating said drawing data based on said design data to supplying it to said drawing engines, first creating means for creating data generation profiles that show on a graph a relationship between said estimated time points to start the generation and to complete the supply for each of said drawing data and positions of said drawing blocks corresponding to said drawing data on said drawn surface, second creating means for creating, on said graph, a drawing speed line that shows change over time of coordinates of said drawing heads with respect to said drawn surface by using a moving speed of said drawing heads relative to said drawn surface, and defining means for comparing said data generation profiles with said drawing speed line, calculating a starting point of said drawing speed line that allows each point on said data generation profiles to precede in time each point on said drawing speed line at all coordinate positions of said drawing heads and, then, defining this starting point as a time point to start the relative movement and the drawing operation of said drawing heads.

8. A drawing-data-generation apparatus according to claim 7, further comprising integrated data generating means for generating integrated data that includes at least: said drawing data; and said drawing start instruction data computed in advance by said computing means.

9. A drawing-data-generation apparatus according to claim 7, wherein said data generation profiles for each of said drawing data are obtained on said graph by interconnecting:
- starting points that are determined by said time points to start the generation of said drawing data and starting coordinates of said drawing blocks corresponding to said drawing data in the direction of said relative movement; and
- ending points that are determined by said time points to complete the supply of said drawing data and ending coordinates of said drawing blocks corresponding to said drawing data in the direction of said relative movement.

10. A drawing-data-generation apparatus according to claim 7, wherein said defining means has:
- first calculating means for calculating an angle between said drawing speed line and a first axis of said graph;
- second calculating means for rotating said data generation profiles by said angle toward said first axis;
- third calculating means for calculating a maximum coordinate value that is taken by said rotated data generation profiles in the direction of a second axis different from said first axis;
- fourth calculating means for determining whether said maximum coordinate value is positive or not;
- fifth calculating means for translating said drawing speed line in the positive direction of said second axis at least by the magnitude of said maximum coordinate value, if said maximum coordinate value is determined to be positive by said fourth calculating means; and
- sixth calculating means for calculating an intersection point of said translated drawing speed line and said second axis and, then, defining the coordinate of said intersection point on said second axis as the time point to start the relative movement and the drawing operation of said drawing heads.

11. A drawing-data-generation apparatus according to claim 7, wherein
said data generation profiles are generated for each group of the drawing blocks aligned in the direction of said relative movement, wherein said each group corresponds to a respective one of a plurality of the drawing heads aligned in a direction orthogonal to the relative movement of said drawing heads, and
said defining means compares a plurality of said data generation profiles with said drawing speed line, calculates a starting point of said drawing speed line that allows each point on said data generation profiles to precede in time each point on said drawing speed line at all coordinate positions of said drawing heads and, then, defines this starting point as a time point to start the relative movement and the drawing operation of said drawing heads.

12. A drawing method in which drawing data, which is required to perform a drawing operation on drawing blocks on a surface that can be drawn at one time by drawing heads moving relatively to said drawn surface, is sequentially generated based on design data and temporarily stored in a memory and, then, sequentially supplied to drawing engines, comprising:
- a computing step of computing drawing start instruction data to start the relative movement and the drawing operation of said drawing heads after a delay from the start of generation of said drawing data so that at least said drawing data is stored in said memory, wherein said computing step includes
  - a measuring step of measuring and estimating time points to start the generation of each of said drawing data and time points to complete the supply of said drawing data to said drawing engines by performing a series of computation processes from generating said drawing data based on said design data to supplying it to said drawing engines,
  - a first creating step of creating data generation profiles that show on a graph a relationship between said estimated time points to start the generation and to complete the supply for each of said drawing data and positions of said drawing blocks corresponding to said drawing data on said drawn surface,
  - a second creating step of creating, on said graph, a drawing speed line that shows change over time of coordinates of said drawing heads with respect to said drawn surface by using a moving speed of said drawing heads relative to said drawn surface, and
  - a defining step of comparing said data generation profiles with said drawing speed line, calculating a starting point of said drawing speed line that allows each point on said data generation profiles to precede in time each point on said drawing speed line at all coordinate positions of said drawing heads and, then, defining this starting point as a time point to start the relative movement and the drawing operation of said drawing heads.

13. A drawing method according to claim 12, further comprising an integrated data generating step of generating integrated data that includes at least: said drawing data; and said drawing start instruction data computed in advance in said computing step,
wherein said drawing apparatus performs a desired drawing operation using said integrated data.

14. A drawing method according to claim 12, wherein said data generation profiles for each of said drawing data are obtained on said graph by interconnecting:
- starting points that are determined by said time points to start the generation of said drawing data and starting coordinates of said drawing blocks corresponding to said drawing data in the direction of said relative movement; and
- ending points that are determined by said time points to complete the supply of said drawing data and ending coordinates of said drawing blocks corresponding to said drawing data in the direction of said relative movement.

15. A drawing method according to claim 12, wherein said defining step has:
- a first calculating step of calculating an angle between said drawing speed line and a first axis of said graph;
- a second calculating step of rotating said data generation profiles by said angle toward said first axis;
- a third calculating step of calculating a maximum coordinate value that is taken by said rotated data generation profiles in the direction of a second axis different from said first axis;
- a fourth calculating step of determining whether said maximum coordinate value is positive or not;
- a fifth calculating step of translating said drawing speed line in the positive direction of said second axis at least by the magnitude of said maximum coordinate value, if said maximum coordinate value is determined to be positive in said fourth calculating step; and a sixth calculating step of calculating an intersection point of said translated drawing speed line and said second axis and, then, defining the coordinate of said intersection point on said second axis as the time point to start the relative movement and the drawing operation of said drawing heads.

16. A drawing method according to claim 12, wherein said data generation profiles are generated for each group of the drawing blocks aligned in the direction of said relative movement, wherein said each group corresponds to a respective one of a plurality of the drawing heads aligned in a direction orthogonal to the relative movement of said drawing heads, and, in said defining step, a plurality of said data generation profiles are compared with said drawing speed line, a starting point of said drawing speed line, which allows each point on said data generation profiles to precede in time each point on said drawing speed line at all coordinate positions of said drawing heads, is calculated and, then, this starting point is defined as the time point to start the relative movement and the drawing operation of said drawing heads.

17. A drawing method according to claim 14, further comprising:
   a determining step of determining whether an amount of said drawing data stored in said memory is larger than a predetermined value; and
   a suspending step of temporarily suspending further generation of said drawing data after completing said supply of said drawing data, if the amount of said drawing data stored in said memory is determined to be larger than said predetermined value in said determining step.

18. A drawing-data-generation method for generating, based on design data, drawing data that is temporarily stored in a memory and, then, supplied to drawing engines of a drawing apparatus for performing a drawing operation on drawing blocks on a surface that can be drawn at one time by drawing heads of the drawing apparatus moving relatively to the drawn surface, comprising:
   a computing step of computing drawing start instruction data to start the relative movement and the drawing operation of said drawing heads after a delay from the start of generation of said drawing data so that at least said drawing data is stored in said memory,
   wherein said computing step includes
      a measuring step of measuring and estimating time points to start the generation of each of said drawing data and time points to complete the supply of said drawing data to said drawing engines by performing a series of computation processes from generating said drawing data based on said design data to supplying it to said drawing engines,
      a first creating step of creating data generation profiles that show on a graph a relationship between said estimated time points to start the generation and to complete the supply for each of said drawing data and positions of said drawing blocks corresponding to said drawing data on said drawn surface,
      a second creating step of creating, on said graph, a drawing speed line that shows change over time of coordinates of said drawing heads with respect to said drawn surface by using a moving speed of said drawing heads relative to said drawn surface, and
      a defining step of comparing said data generation profiles with said drawing speed line, calculating a starting point of said drawing speed line that allows each point on said data generation profiles to precede in time each point on said drawing speed line at all coordinate positions of said drawing heads and, then, defining this starting point as a time point to start the relative movement and the drawing operation of said drawing heads.

19. A drawing-data-generation method according to claim 18, further comprising an integrated data generating step of generating integrated data that includes at least: said drawing data; and said drawing start instruction data computed in advance in said computing step.

20. A drawing-data-generation method according to claim 18, wherein said data generation profiles for each of said drawing data are obtained on said graph by interconnecting:
   starting points that are determined by said time points to start the generation of said drawing data and starting coordinates of said drawing blocks corresponding to said drawing data in the direction of said relative movement; and
   ending points that are determined by said time points to complete the supply of said drawing data and ending coordinates of said drawing blocks corresponding to said drawing data in the direction of said relative movement.

21. A drawing-data-generation method according to claim 18, wherein said defining step has:
   a first calculating step of calculating an angle between said drawing speed line and a first axis of said graph;
   a second calculating step of rotating said data generation profiles by said angle toward said first axis;
   a third calculating step of calculating a maximum coordinate value that is taken by said rotated data generation profiles in the direction of a second axis different from said first axis;
   a fourth calculating step of determining whether said maximum coordinate value is positive or not;
   a fifth calculating step of translating said drawing speed line in the positive direction of said second axis at least by the magnitude of said maximum coordinate value, if said maximum coordinate value is determined to be positive in said fourth calculating step; and
   a sixth calculating step of calculating an intersection point of said translated drawing speed line and said second axis and, then, defining the coordinate of said intersection point on said second axis as the time point to start the relative movement and the drawing operation of said drawing heads.

22. A drawing-data-generation method according to claim 18, wherein
   said data generation profiles are generated for each group of the drawing blocks aligned in the direction of said relative movement, wherein said each group corresponds to a respective one of a plurality of the drawing heads aligned in a direction orthogonal to the relative movement of said drawing heads, and
   in said defining step, a plurality of said data generation profiles are compared with said drawing speed line, a starting point of said drawing speed line, which allows each point on said data generation profiles to precede in time each point on said drawing speed line at all coordinate positions of said drawing heads, is calculated and, then, this starting point is defined as the time point to start the relative movement and the drawing operation of said drawing heads.

* * * * *